United States Patent
Liu

(10) Patent No.: US 6,833,944 B2
(45) Date of Patent: Dec. 21, 2004

(54) MEMS ENCLOSURE

(75) Inventor: Jwei Wien Liu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/763,291

(22) Filed: Jan. 23, 2004

(65) Prior Publication Data

US 2004/0150058 A1 Aug. 5, 2004

Related U.S. Application Data

(62) Division of application No. 09/991,446, filed on Nov. 9, 2001, now Pat. No. 6,704,131.
(60) Provisional application No. 60/249,105, filed on Nov. 16, 2000.

(51) Int. Cl.$^7$ .............................................. G02B 26/00
(52) U.S. Cl. ....................................... 359/298; 353/31
(58) Field of Search ................................. 359/290, 298, 359/211, 212, 223, 230, 237, 629, 638; 353/98, 97, 31

(56) References Cited

U.S. PATENT DOCUMENTS

| 4,412,129 A | 10/1983 | Duncan |
| 5,526,234 A | 6/1996 | Vinciarelli et al. |
| 6,278,542 B1 * | 8/2001 | Hewlett ...................... 359/291 |
| 6,589,625 B1 | 7/2003 | Kothari et al. |

* cited by examiner

*Primary Examiner*—Scott J. Sugarman
*Assistant Examiner*—Richard Hanig
(74) *Attorney, Agent, or Firm*—Charles A. Brill; Wade James Brady, III; Frederick J. Telecky, Jr.

(57) ABSTRACT

A low-cost, high-performance, reliable micromirror package (300) that replaces the ceramic substrate in conventional packages with a printed circuit board substrate (30) and a molded plastic case (33), and the cover glass with a window (36), preferably an optically clear plastic window. The printed circuit board substrate (30) allows for either external bond pads or flex cable connection of the micromirror package to the projector's motherboard. These packages support flexible snap-in, screw-in, ultrasonic plastic welding, or adhesive welding processes to overcome the high cost seam welding process of many conventional packages.

2 Claims, 4 Drawing Sheets

MEMS ENCLOSURE

This application is a Divisional of Application Ser. No. 09/991,446, filed Nov. 9, 2001, now U.S. Pat. No. 6,704,131, which claims priority under 35 USC §119(e)(1) of Provisional Application No. 60/249,105, filed Nov. 16, 2000.

BACKGROUND OF THE INVENTION

1. Field of the Invention

The present invention relates to the packaging of semiconductor chips and particularly to that of micro-electrical mechanical systems (MEMS) such as micromirror devices.

2. Description of the Related Art

Packaging is a critical part of producing a high-performance MICROMIRROR for use in optical applications. Typically in a micromirror, the mirrors land on the substrate surface of the device. To avoid the mirrors from sticking, it is necessary that the micromirror be packaged in a controlled environment, with minimum amounts of moisture, adhesives, dust, and other contaminants. In order to provide such an environment, hermetically sealed packages are often used. However, the cost of such packages and the negative impact on the assembly process is extremely high.

The packaging of micromirror chips for use in projection display and other electro-optical applications has continued to present a cost barrier that contributes to higher prices for these products. A lower cost micromirror package is required to reduce the cost of these high-resolution, digital projectors. Today's micromirror packages are mostly built on custom designed ceramic substrates and have expensive glass covers (lids), which are seam welded or fixed in place with an adhesive. These packages are not only expensive, but they require a low throughput process that reduces the product cycle time.

FIG. 1 is a drawing of a welded package. This is a hermetically sealed package that consists of a ceramic substrate 10 with a built-in Kovar lid-attaching ring 11 on its surface and a lid assembly, which consists of a Kovar frame 12 with built-in an optical quality glass window 13. In the assembly process the micromirror die 14 is attached to the substrate to provide both mechanical and thermal stability, as well as an electrical ground plane. The micromirror leads are bonded to pads on the substrate 10 which extend to external package pads on the edges or bottom of the package. The package is filled with an inert gas and then the lid assembly is seam welded at the two mating surfaces 15 between the lid frame 12 and lid-attaching ring 11.

The adhesive sealed package shown in FIG. 2 has been used in place of the welded package to lower the cost and improve the manufacturing throughput. This package is similar in that it has a ceramic substrate 20 but the cover glass 21 (lid) is a single piece of optical quality glass. In this case, the micromirror 22 is mounted and bonded out in the substrate's 20 cavity and then the cover glass 21 is attached using an adhesive. The main advantages are that the assembly process is somewhat simplified, which improves the manufacturing throughput and the glass covers 21 are simple pieces of glass that can be sourced from various vendors.

The micromirror packages discussed above perform very well but are too expensive and tend to limit cost reduction efforts due to their high cost material and labor content. What is needed is a simple micromirror packaging approach that is low cost, easily assembled, and reliable. The invention disclosed herein fulfills this need.

SUMMARY OF THE INVENTION

This invention discloses a low cost, high performance, reliable micromirror package that overcomes many of the shortcomings of the conventional ceramic packages commonly used. This approach replaces the ceramic substrate with a printed circuit board substrate, the ceramic case with a molded plastic case, and the cover glass with an optical quality plastic window or lid. The printed circuit board substrate allows for either external bond pads or flex cable connection of the micromirror package to the projector's motherboard. These packages support flexible snap-in, screw-in, ultrasonic plastic welding, or adhesive welding processes to overcome the low throughput, high cost, seam welding process of many conventional packages.

Other advantages include the following:
1. Requires no seam welding,
2. readily supports assembly automation,
3. uses multiple source, commodity piece parts,
4. light weight,
5. has built-in thermal plane on the bottom of the printed circuit board substrate,
6. supports standard chip connection methods, such as edge pad, grid-pad, or flex cable, and
7. lower cost.

DESCRIPTION OF THE VIEWS OF THE DRAWINGS

The included drawings are as follows:

FIG. 4 is an exploded view of the micromirror package in FIG. 3a.

FIG. 6 is an exploded view of the micromirror package in FIG. 5a.

DETAILED DESCRIPTION

This invention discloses a low-cost, easily assembled micromirror package. The packages of this invention use fiberglass printed circuit board substrates, molded plastic parts, and lightweight plastic windows instead of ceramic parts and glass windows. The details of the two embodiments are discussed below.

Figure 1:
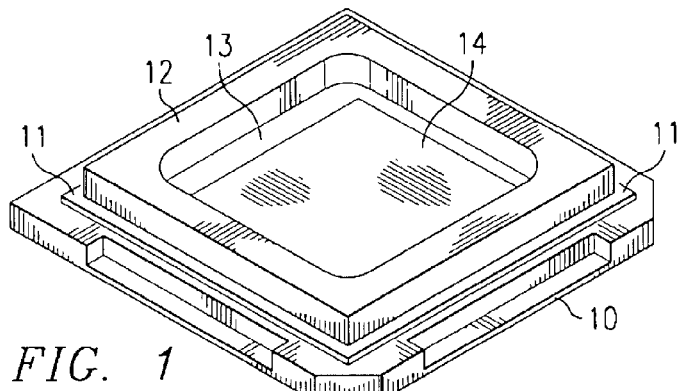
FIG. 1 is a perspective view of a conventional welded hermetically sealed, ceramic, micromirror package. (prior art)
Figure 2:
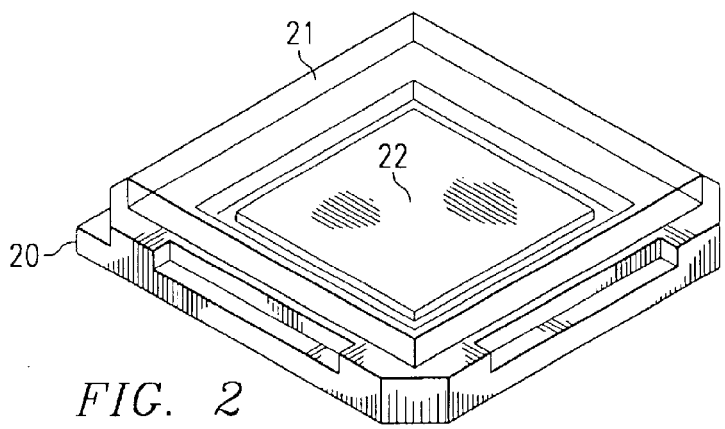
FIG. 2 is a perspective view of a conventional epoxy sealed, ceramic, micromirror package. (prior art)
Figure 3A:
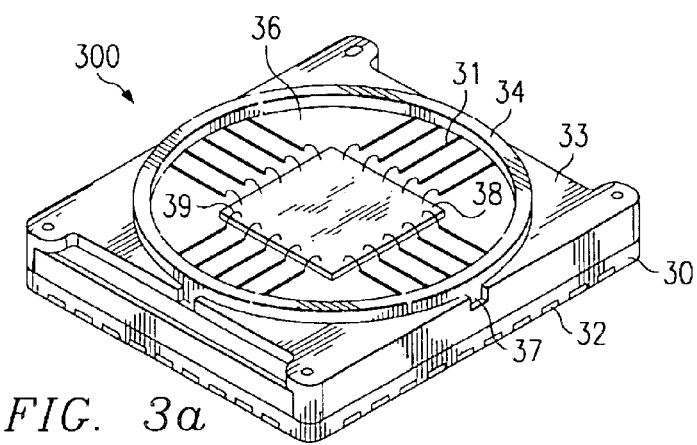
FIG. 3a is a perspective view of the low-cost, snap-on window, micromirror package of a first embodiment of this invention.

FIG. 3a shows a first embodiment of the micromirror package 300 of this invention. The package is comprised of a printed circuit board (PCB) base (substrate) 30, a molded plastic case 33, a top window-retaining ring 37, and a plastic optical window 36, enclosing a micromirror 38. This invention also allows for the attachment of an optical aperture in the window area of the package, which will prevent stray light from entering around the edge of the package where it can bounce around and contaminate the light coming from the micromirror mirrors. The high cost ceramic used in many conventional packages is replaced by the lower cost PCB 30 (example—FR4) and molded plastic 33 assembly. The PCB substrate 30 contains circuit traces 31, which are used to bond out the micromirror's 38 leads to the outside by means of either side contacts 32 or a grid-pad matrix (not shown) on the bottom of the package 300. Bond wires 39 are shown connecting the micromirror 38 to the PCB traces 31. A thermal ground plane is also included on the bottom surface of the PCB 30, which is in effect the bottom of the package 300. The plastic case 33 is molded around the PCB 30 substrate to form a seal at the bottom of the package. There is an O-ring mating flange 34, shown in FIG. 3b, located on the top of the plastic case 33. The plastic case 33 also has snap-pockets where the window 36 mounting-clamp 37 attaches to the assembly.

Figure 3B:
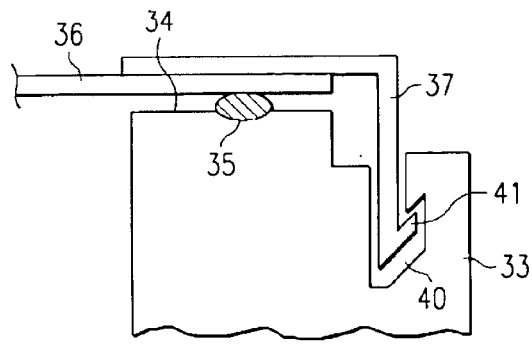
FIG. 3b is a sectional view of one portion of the package of FIG. 3a showing the lid retention mechanism.

FIG. 3b is a sectional view of one side of the package showing the top window 36 mounting and clamping mechanism. As shown, the plastic case 33 has snap-pockets 40 molded into it to contain the optical plastic window-clamping ring 37. An O-ring 35 sits on the O-ring-seal flange 34 and then the optical plastic window 36 sits on top of the O-ring. Finally, the mounting clamp 37 is placed over and around the perimeter of the top window 36 and pressed down, compressing the O-ring 35, locking the snap-hooks 41 into the snap-pockets 40 formed in the molded plastic case 33, sealing the top portion of the package.

Figure 4:
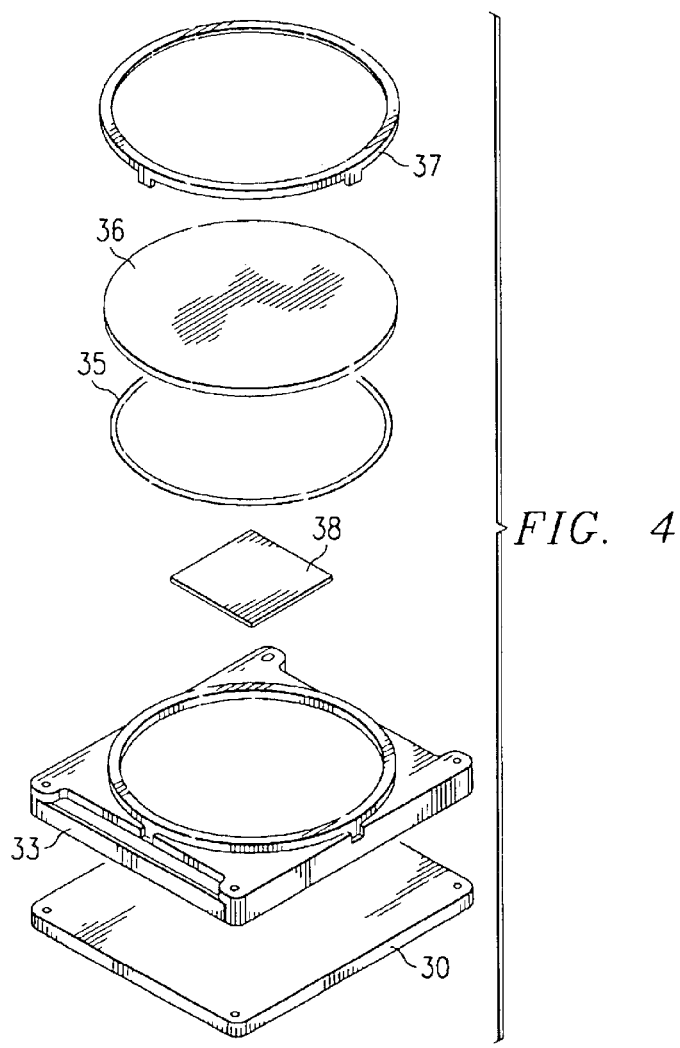

FIG. 4 is an exploded view of the micromirror package of the first embodiment of this invention. The PCB 30 and the molded plastic case 33 are mated together in the mold when the plastic case is manufactured, with the PCB 30 becoming the bottom of the package. The micromirror 38 is attached to the PCB 30 and bonded out to the circuit interconnect traces 31, shown in FIG. 3a, using standard semiconductor processes. An O-ring 35 is then placed on the O-ring-seal flange 34 surface, shown in FIG. 3a, of the package. Finally, the window 36, preferably an optically clear plastic window or a glass window, is placed on top of the O-ring 35, the mounting clamp 37 is place over and around the edges of the window 36, and the snap-hooks of retaining ring 37 are snapped into the snap-pockets 40 in the plastic case 33, compressing the O-ring, to provide a lightweight, sealed assembly.

Figure 5A:
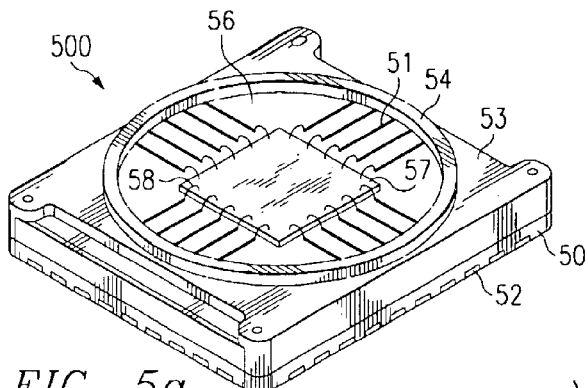
FIG. 5a is a perspective view of the low-cost, adhesive attached window, micromirror package of another embodiment of this invention.

FIG. 5a is a drawing showing a second embodiment of the micromirror package 500 of this invention, which uses an adhesive to attach the optically clear top window 56. The package is comprised of a printed circuit board (PCB) base 50, a molded plastic case 53 having an adhesive-seal flange (surface) 54, and an optical window 56, and encloses a micromirror 57. This package is similar to that of the first embodiment except for the way the optical window 56 is attached. The bottom of the package is a PCB 50 with circuit traces 51 bringing the micromirror leads out to edge pads 52 or to a bottom grid-pad matrix. As in the earlier case, the micromirror is attached to the PCB and bond wires 58 are attached between the micromirror input/output pads and the PCB traces 51. A thermal ground plane is also included on the bottom surface of the PCB 50, which is in effect the bottom of the package 500. The primary difference in this embodiment is that the O-ring mating flange of the earlier embodiment is replaced with an adhesive-seal flange 54, which is an integral part of the molded plastic case 53. In this case, the snap pockets in the plastic case are no longer required. This package has all the benefits of the earlier package; low-cost, lightweight, easy assembly, and good reliability.

Figure 5B:
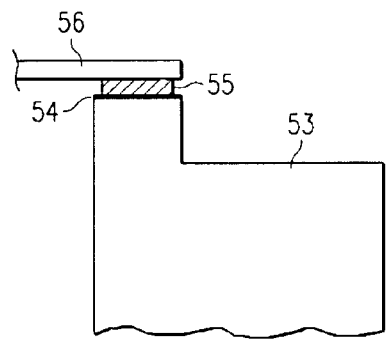
FIG. 5b is a sectional side view of a portion of the package of FIG. 5a showing the adhesively sealed lid.

FIG. 5b is a sectional view of the optical plastic window 56 mounting technique for the package in the second embodiment of the invention. As shown, the plastic case 53 has an adhesive-seal flange 54 built into it. The adhesive 55 is dispensed on top of the seal flange 54 surface and the plastic window 56 sits on top of the adhesive 55. The adhesive is then activated and cured to bond the window 56 to the molded case 53 to provide a completely sealed package.

Figure 6:
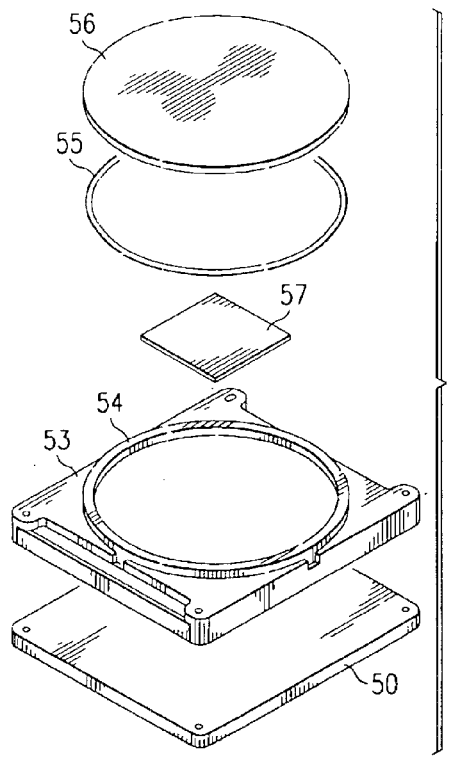

FIG. 6 is an exploded view of the low-cost micromirror package of the second embodiment of this invention. The PCB 50 and the molded plastic case 53 are mated together in the mold when the plastic case is manufactured, with the PCB 50 becoming the bottom of the package. The micromirror 57 is attached to the PCB 50 and bonded out to the circuit interconnect traces 51 (FIG. 5a) using standard semiconductor processes. An adhesive 55 is then dispensed on to the adhesive-seal flange 54 surface of the molded plastic case 53 and the optically clear plastic window 56 is placed on top of the adhesive 55. Finally, the adhesive is activated and cured to properly seal the package.

Figure 7:
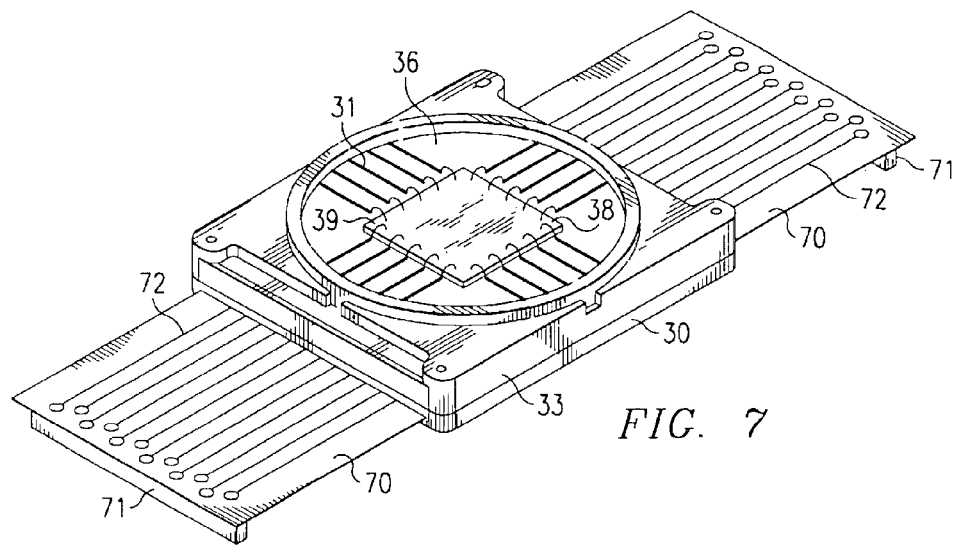
FIG. 7 is perspective view of the low-cost micromirror package of this invention configured with flexible interconnect cables.

FIG. 7 shows the micromirror packages of this invention with flexible interconnect cables integrally built into the package. Although FIG. 7 shows the first embodiment of the invention, either of the two packages discussed above can be configured with flexible interconnect cables. The package shown in FIG. 7, with flex-cable interconnect capability, is comprised of a printed circuit board base 30 with PCB leads 31, a molded case 33 with a snap connected optical plastic window 36, a mounted micromirror 38, bonding wires 39 connecting the micromirror 38 to the PCB traces 31, and flexible cables 70 (two shown) with lead traces 72 and attached connectors 71. This configuration can have up to 4 flex-cables. The connectors 71 are used to connect the micromirror(s) into a motherboard or other bus.

Figure 8:
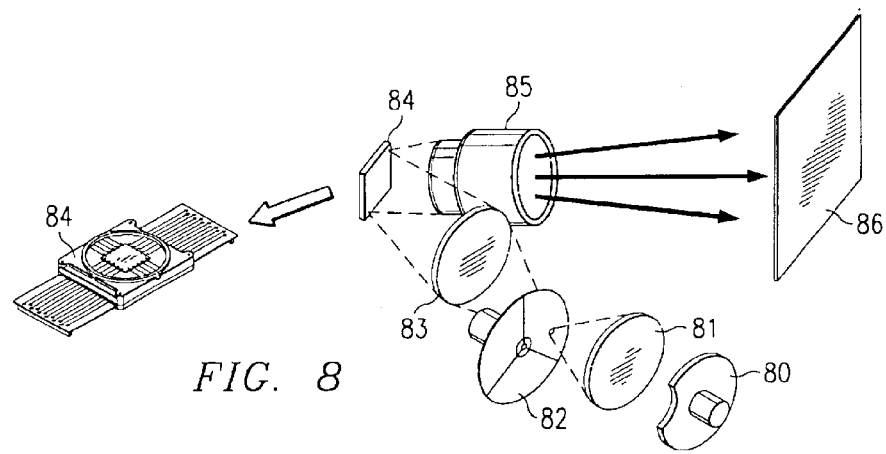
FIG. 8 is a system level diagram of a one-micromirror projection display system incorporating the low-cost micromirror package of this invention.

FIG. 8 shows a system level block diagram for a single micromirror projection display system. The system is comprised of a light source 80, a first condenser lens 81, a motor/color filter wheel assembly 82, a second condenser lens 83, a low-cost micromirror in the package of this invention 84, a fixed or zoom projection lens 85, and a viewing screen 86.

Figure 9:
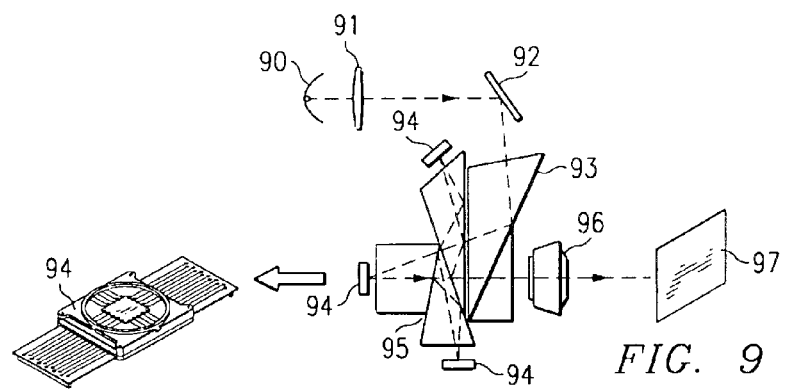
FIG. 9 is a system level diagram of a 3-micromirror projection display system incorporating three of the low-cost micromirror packages of this invention.

Another example of a high-brightness micromirror projection display, which uses three of the low-cost micromirror packages of this invention, is shown in FIG. 9. This system is comprised of a lamp (light source) and reflector assembly 90, a condenser lens 91, a turning mirror 92, a total internal reflective (TIR) prism 93, three micromirrors (for red, green, and blue light) in the low-cost package of this invention 94, color splitting/color combining prisms 95, a fixed or zoom lens 96, and a viewing screen 97.

While this invention has beer described in the context of two preferred embodiments, it will be apparent to those skilled in the art that the present invention may be modified in numerous ways and may assume embodiments other than that specifically set out and described above. Accordingly, it is intended by the appended claims to cover all modifications of the invention that fall within the true spirit and scope of the invention.

What is claimed is:

1. A high-brightness micromirror projection display comprising:
 - a light source for providing a beam of light along a light path;
 - a first condenser lens on said light path for receiving said beam of light;
 - a total internal reflective prism receiving said beam of light;
 - a color-splitting prism assembly receiving said beam of light from said total internal reflective prism;
 - three micromirrors mounted in a low-cost molded plastic packages with built-in printed circuit board bases and windows for selectively modulating said filtered beam of light; and
 - a projection lens for receiving said modulated beam of light and focusing said modulated beam of light on an image plane.

2. The micromirror projection display of claim 1, wherein said micromirror packages contain flex-circuit interconnect cables.

* * * * *